United States Patent [19]

Dichiara et al.

[11] Patent Number: 5,554,485

[45] Date of Patent: *Sep. 10, 1996

[54] MID AND DEEP-UV ANTIREFLECTION COATINGS AND METHODS FOR USE THEREOF

[75] Inventors: Robert R. Dichiara, Middletown; James T. Fahey, Poughkeepsie; Pamela E. Jones, Bronx; Christopher F. Lyons, LaGrangeville; Wayne M. Moreau, Wappingers Falls; Ratnam Sooriyakumaran, Fishkill; Gary T. Spinillo, Wappingers Falls; Kevin M. Welsh, Fishkill; Robert L. Wood, Poughkeepsie, all of N.Y.

[73] Assignee: International Business Machines Corporation, Armonk, N.Y.

[ * ] Notice: The term of this patent shall not extend beyond the expiration date of Pat. No. 5,401,614.

[21] Appl. No.: 315,271

[22] Filed: Sep. 29, 1994

Related U.S. Application Data

[60] Division of Ser. No. 17,938, Feb. 16, 1993, Pat. No. 5,401,614, which is a continuation-in-part of Ser. No. 845,404, Mar. 3, 1992, abandoned.

[51] Int. Cl.$^6$ ............................................. G03C 5/00
[52] U.S. Cl. ............................ 430/271.1; 430/270.1; 430/272.1; 430/323; 522/6; 522/904
[58] Field of Search ........................... 430/270, 271, 430/272, 323; 522/904, 6

[56] References Cited

U.S. PATENT DOCUMENTS

| | | | |
|---|---|---|---|
| 3,642,480 | 2/1972 | Vrancker | 96/48 |
| 4,008,083 | 2/1977 | Pye | 350/160 |
| 4,137,365 | 1/1979 | Wydeven et al. | 428/412 |
| 4,362,809 | 12/1982 | Chen et al. | 430/312 |
| 4,370,405 | 1/1983 | O'Toole et al. | 430/312 |
| 4,405,707 | 9/1983 | Bierhenke et al. | 430/281 |
| 4,491,628 | 1/1985 | Ito et al. | 430/176 |
| 4,515,886 | 5/1985 | Yamaoka et al. | 430/270 |
| 4,529,685 | 7/1985 | Borodovsky | 430/311 |
| 4,587,203 | 5/1986 | Brault et al. | 430/325 |
| 4,592,993 | 6/1986 | Ohnishi | 430/325 |
| 4,609,614 | 9/1986 | Pampalone et al. | 430/323 |
| 4,623,609 | 11/1986 | Harita et al. | 430/325 |
| 4,644,025 | 2/1987 | Sakaeami | 526/261 |
| 4,746,596 | 5/1988 | Yoshioka et al. | 430/325 |
| 4,758,305 | 7/1988 | Bonifield et al. | 156/643 |
| 4,759,990 | 7/1988 | Yen | 428/421 |
| 4,761,464 | 8/1988 | Zeigler | 528/30 |
| 4,782,009 | 11/1988 | Bolon et al. | 430/326 |
| 4,822,718 | 4/1989 | Latham et al. | 430/271 |
| 4,855,199 | 8/1989 | Bolon et al. | 430/18 |
| 4,871,646 | 10/1989 | Hayase et al. | 430/192 |
| 4,910,122 | 3/1990 | Arnold et al. | 430/313 |
| 5,057,399 | 10/1991 | Flaim et al. | 430/299 |
| 5,110,697 | 5/1992 | Lamb et al. | 430/18 |
| 5,126,289 | 6/1992 | Ziger | 437/231 |
| 5,234,990 | 8/1993 | Flaim et al. | 524/609 |
| 5,271,803 | 12/1993 | Yen | 156/645 |
| 5,401,614 | 3/1995 | Dichiara et al. | 430/323 |

FOREIGN PATENT DOCUMENTS

| | | | |
|---|---|---|---|
| 0159428 | 4/1984 | European Pat. Off. | G03F 7/02 |
| 0264650 | 4/1984 | European Pat. Off. | G03F 7/02 |

OTHER PUBLICATIONS

Lessor, et al. *IBM Tech. Discl. Bulletin*, vol. 20, No. 11B, Apr. 1978.

O'Toole, et al. *IEEE*, "Linewidth Control in Projection Lithography Using A Multilayer Resist Process" vol. Ed-28, No. 11, Nov. 1981.

Brewer, Et al., *J. Apl. Photogr. Eng.*, "The Reduction of the Standing Wave Effect In Positive Photoresists" 184–186, vol. 7 No. 6 1981.

Lin, et al., *J. Appl. Phys.* "Improvement of Linewidth Control With Anti-Reflective Coating In Optical Lithography" 1110–1115, 1984.

R. West, *J. Organomet. Chem.* "The Polysilane High Polymers" 300, 327 (1986).

Horn, *Solid State Technology*, "Antireflection Layers And Planarization For Microlithography", 57–62, 1991.

L. Schlegel, et al. *J. Vac. Sci. Technol.*, "Determination of Acid Diffusion In Chemical Amplification Positive Deep Ultraviolet Resists", B9, 278 (1991).

Dudley, et al., *Proc. Spie*, "Enhancement of Deep UV Patterning Integrity and Process Control Using Antireflective Coating", 1672, 638 (1992).

Zhang, et al. "Organosilane Polymers: —Diphenylsilyene—" Journal of Polymer Science, Polymer Letters. Ed. vol. 23, No. 9, Sep. 1985, pp. 479–485.

*Primary Examiner*—Mark Chapman
*Attorney, Agent, or Firm*—Dale M. Crockatt

[57] ABSTRACT

An antireflective coating composition for use with chemically amplified photoresist compositions comprising a polymer composition which is highly absorbent to mid and deep UV radiation, which is substantially inert to contact reactions with a chemically amplified photoresist composition, and which is insoluble in the developer for the chemically amplified photoresist composition.

20 Claims, 3 Drawing Sheets

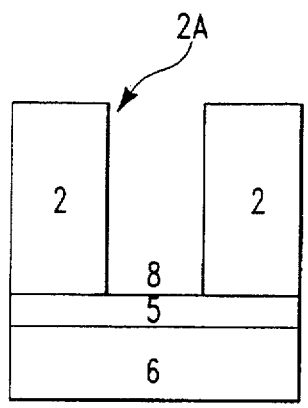
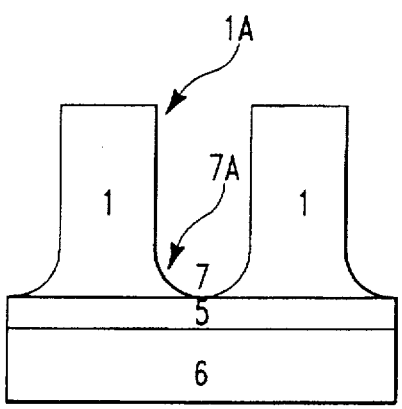
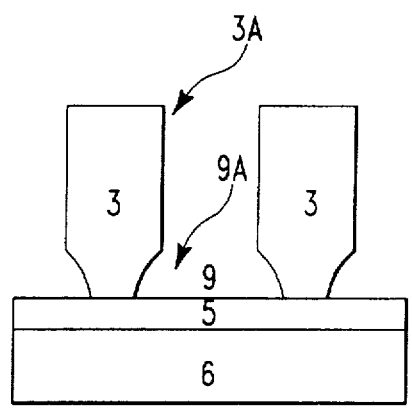
FIG. 1A     FIG. 1B     FIG. 1C
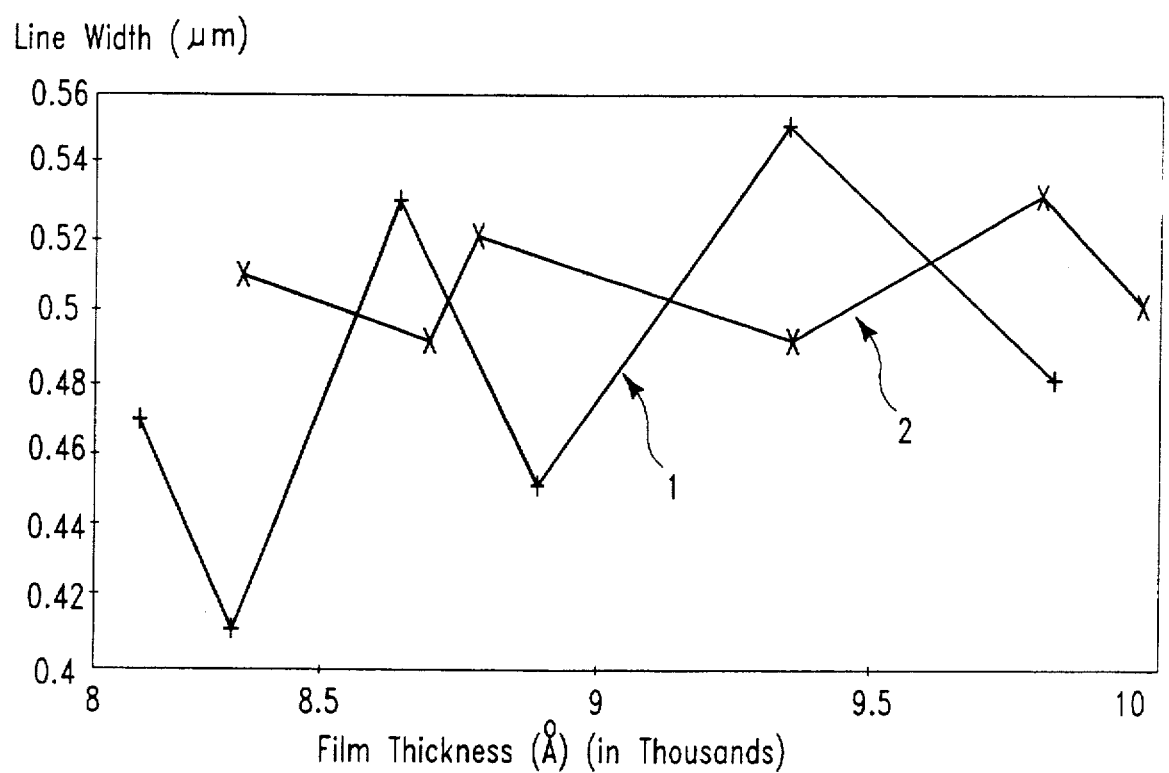
FIG. 2

APEX-E OVER STEPS

APEX-E/BARL (1300Å) OVER STEPS

MID AND DEEP-UV ANTIREFLECTION COATINGS AND METHODS FOR USE THEREOF

RELATED APPLICATION

This application is a division of U.S. patent application Ser. No. 08/017,939, filed Feb. 16, 1993, now U.S. Pat. No. 5,401,614 which is a continuation-in-part of U.S. patent application Ser. No. 07/845,404, filed Mar. 3, 1992, entitled "Mid and Deep UV Antireflection Coatings and Methods for Use Thereof" abandoned.

FIELD OF INVENTION

The present invention is directed to antireflective coating compositions for use with chemically amplified photoresist compositions. More particularly, the invention is directed to film forming compositions which are highly absorbent to mid and/or deep UV radiation and which are insoluble in the chemically amplified photoresist compositions and the developers therefor. The invention also provides methods for forming photoresist images having improved linewidth control.

BACKGROUND

As semiconductor manufacturers have sought to be able to fabricate devices having a higher degree of circuit integration to improve device performance, it has become necessary to use photolithographic techniques using shorter wavelengths in the mid and deep UV spectra to achieve fine features. In the process of making the desired very fine patterns many optical effects are experienced which lead to distortion or displacement of images in the photoresist that are directly responsible for wiring line width variations, opens and shorts, all of which can lead to deteriorated device performance. Many of these optical effects are attributable to substrate geometry and reflectivity influences that include halation and other reflected light scattering effects which may be due to uneven topography or the varying (wavelength dependent) reflectivity of the substrates and wires or layers being patterned thereon to define the desired features. Such effects are further exacerbated by both the non-uniformity of the photoresist film and film thickness. These effects are manifested in lithographic patterns uneven line width, often with "reflective notching", due to standing wave phenomena, non-vertical pattern sidewalls.

U.S. Pat. No. 4,910,122 to Arnold et al. is directed to processes for overcoming the reflectivity problems experienced in thin film lithography used in the fabrication of circuits of increasing density or integration. The process uses an antireflective film composition comprising a polymer having low surface energy (and which may incorporate a dye compound) as a layer interposed between the substrate and the imaging layer which reduces the dilatory reflective effects and which is removable by the photoresist developer.

It has been discovered that such processes are not compatible with chemically amplified resist compositions. Chemically amplified photoresist compositions are those in which the reaction continues through a mechanism that involves image formation of photoacid production and secondary acid production affects. An example of such composition is found in U.S. Pat. No. 4,491,628 to Ito et al. The codevelopable antireflective coatings adversely react with the components of the photoresist.

SUMMARY OF THE INVENTION

The present invention provides an antireflective coating composition for use with chemically amplified photoresist compositions comprising a polymer composition which is highly absorbent to mid and/or deep UV radiation, and which is substantially inert to contact reactions with a chemically amplified photoresist composition, and which is insoluble in the developer for the chemically amplified photoresist composition.

The polymeric composition used in the antireflective coating is selected from the group consisting of polysilanes which strongly absorb ultraviolet radiation having one or more wavelengths in the mid and/or deep UV region, polyvinyl aromatic compositions which strongly absorb radiation having one or more wavelengths in the deep UV region, pre-imidized polyimides which strongly absorb radiation having one or more wavelengths in the deep UV region, and polyaryl ethers which strongly absorb radiation having one or more wavelengths in the deep UV region. The polymers of the composition are further characterized as able to form a discrete underlayer, are immiscible with the photoresist, and are not removable during normal wet development of the photoresist. The pre-imidized polyimides are further characterized as insoluble in aqueous alkaline photoresist developer solutions, and soluble in organic solvents which are not used in the overlaying photoresist composition. The polyvinyl aromatic composition may further be characterized as either cross-linkable or, in the alternative, not cross-linkable, and where such polyvinyl aromatic composition is cross-linkable, the compositions may be cross-linked by processing or alternatively may not be cross-linked during processing. In order to effectively protect against image distortion, the antireflective coating should have a high optical density at the exposing wavelength. Preferably, the optical density should be at least 0.25 at each wavelength for which the resist is sensitive and corresponding to each particular wavelength of the exposing light. Since relatively thin coatings contribute to the ease in running an uncomplicated process, it is preferred to employ material exhibiting an optical density of at least $2.0/\mu m$ to overcome lithographic variations due to reflectivity.

BRIEF DESCRIPTION OF THE DRAWINGS

FIGS. 1A, 1B, and 1C are cross sectional views of hypothetical photoresist relief images showing ideal images, additive defects, and subtractive defects.

FIG. 2 is a graph showing a comparison of line width variations of compositions with and without the antireflective coating compositions of the invention.

DESCRIPTION OF THE PREFERRED EMBODIMENT

Figure 3A:
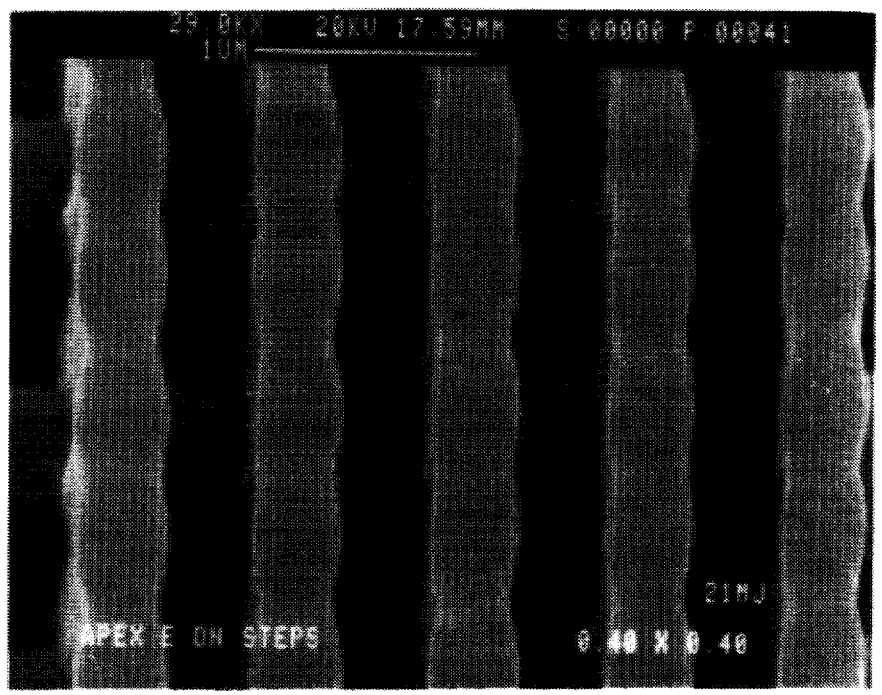
FIGS. 3A and 3B are scanning electron micrographs showing partial perspective views of photoresist lines and spaces after processing with and without the antireflective coating compositions of the invention.

According to the invention, antireflective coating compositions are provided for use with chemically amplified photoresist compositions. These polymer compositions are characterized by being highly absorbent to mid and deep UV radiation, by being substantially inert to contact reactions with a chemically amplified photoresist composition, and by being substantially insoluble in the developer for the chemically amplified photoresist composition.

The polymeric composition used in the antireflective coating is selected from the group consisting of polysilanes which strongly absorb ultraviolet radiation having one or more wavelengths in the mid and/or deep UV region, polyvinyl aromatic compositions which strongly absorb radiation having one or more wavelengths in the deep UV region, pre-imidized polyimides which are insoluble in aqueous alkaline photoresist developer solutions, and which polyimides strongly absorb radiation having one or more wavelengths in the deep UV region, and polyaryl ethers which strongly absorb radiation having one or more wavelengths in the deep UV region. The polymers of the composition are additionally characterized as capable of forming a discrete underlayer, are immiscible with the photoresist, and are not removable during normal wet development of the photoresist. The pre-imidized polyimides are further characterized as insoluble in aqueous alkaline photoresist developer solutions, and soluble in organic solvents which are not used in the overlaying photoresist composition. Preferred pre-imidized polyimides are soluble in a solvent selected from the group consisting of cyclohexanone, cyclopentanone, dioxane, gamma butyrolactone, and tetrahydrofuran, and are insoluble in one of acetate esters or propionate esters or lactate esters. In order to effectively protect against image distortion, the antireflective film should have a high optical density at the exposing wavelength. Preferably, the absolute optical density should be at least 0.25 at each wavelength for which the resist is sensitive and corresponding to each particular wavelength of the exposing light. In a preferred embodiment of the present invention for a deep UV lithographic process, the antireflective film should have an absolute optical density of at least 0.25 through the range of wavelengths from 235 to 280 nm. Such thin films are easy to apply, do not adversely affect such exposure parameters as depth of focus, exposure dose, and process latitude, and may be facilely removed after processing. Use of the compositions of the invention in a lithographic process is particularly advantageous in relaxing the requirement for strict control of the photoresist coating thickness. The films may remain in the structure or may alternatively be removed depending upon the requirements of subsequent processes or upon the requirements of the device ultimately produced.

It has been found that lithographic patterns are substantially improved by the incorporation of the mid and/or deep UV antireflective coating of the present invention into a lithographic process. Without an underlying antireflective film, linewidth variations arise in the imaged and developed resist over underlying reflective features having uneven topography. The variations are due to the non-uniform coupling of light into the photoresist film resulting from the dependence of the standing wave contribution on the localized thickness of the resist. With an underlying antireflective film, reflected light is minimized by the absorbance of incident light by the antireflective coating. Standing waves are diminished and the lithographic pattern profiles obtained are essentially vertical. Neither the "feet" (protrusions from the bottom of the sidewalls of each line into the space between lines) which are otherwise observed in conventional lithography, nor the "flairs" (a non-vertical sidewall or a severe foot) which are otherwise observed with low surface energy polymer coatings, are detected in processes practiced with the present invention.

It has also been unexpectedly discovered that the antireflective compositions of the invention do not admix with nor form an interfacial layer with many chemically amplified resists. Interfacial layers are transitional regions between two polymeric layers wherein the interfacial layers have compositions characterized by the presence of species from each adjoining layer. Interfacial layers are typically undesirable. It is presumed that the antireflective compositions of the present invention demonstrate these beneficial properties as a result of the low solubility or insolubility of the components of the antireflective film in the solvents used for the chemically amplified photoresists and also as a result of the immiscibility of the antireflective layer components in the photoresist composition.

Furthermore, it has also been surprisingly found that the antireflective compositions of the present invention do not adversely affect the sensitivity of the overlying chemically amplified photoresist, nor adversely affect the lower sidewall profile in the processed relief image. Certain chemically amplified photoresists may exhibit an increase, or less commonly a decrease, in the required dose of exposing radiation for patterning after contact with, or exposure to, certain deleterious chemical species. Where such deleterious species are present in the film underlaying the chemically amplified resist, desensitization, or hypersensitization, of the chemically amplified resist takes place by means of a contact reaction with the film containing the deleterious species. The contact reaction may be limited to the interfacial region, or may be exacerbated by means of diffusion of the deleterious species into the chemically amplified resist film.

The lithographic result of a contact reaction is easily understood by reference to FIGS. 1A, 1B, and 1C. Referring to FIG. 1A, a representation of an ideal photoresist relief image over an antireflective layer is shown. In FIG. 1A, lines of resist (2) are shown overlaying an antireflective layer (5), said antireflective layer being coated on a substrate (6). The sidewalls (2a) are vertical, and no foot or scum is present in the space (8). Referring to FIG. 1B, an additive defect in the photoresist relief image is shown, which is understood to mean that additional unwanted resist material is present after development. In FIG. 1B, lines of resist (1) are shown overlaying an antireflective layer (5), said antireflective layer being coated on a substrate (6). The sidewalls (1a) are not vertical, and a foot is present. In severe cases, the bottom of space (7) may remain unopened after development. Referring to FIG. 1C, a subtractive defect in the photoresist relief image is shown, which is understood to mean that resist material has been undesirably removed after development. In FIG. 1C, lines of resist (3) are shown overlaying an antireflective layer (5), said antireflective layer being coated on a substrate (6). The sidewalls (3a) are not vertical, exhibiting a notching at the bottom of the line (3). In severe cases, the line may be entirely lost during the development process.

In a positive tone, acid amplified photoresist, where the deleterious species emanating from the underlying film is basic in nature, the contact reaction is manifested by the formation of an additive defect as shown in FIG. 1B. In order to compensate for the defect, the exposure dose is increased, and the resist is deemed to be desensitized. In a negative tone, acid amplified photoresist, where the deleterious species is basic in nature, the contact reaction is manifested by the formation of a subtractive defect as shown in FIG. 1C, the exposure dose requirement is increased, and the resist is deemed desensitized. As the practitioner will understand, the character of the observed defects are reversed for an acid amplified photoresist where the deleterious species is acidic in nature, resulting in a decreased exposure dose requirement., or hypersensitivity. Similarly, where the chemically amplified resist involves photogenerated base catalysis, the presence of a deleterious acidic species ultimately leads to desensitization, and a basic species leads to hypersensitization.

Another unexpectedly advantageous property of the present invention is that the catalytic component of an exposed and undeveloped chemically amplified photoresist does not exhibit diffusion into the underlaying antireflective composition, another example of an adverse contact reaction. It is known in the art that the mobile acid moiety which is generated by radiation absorbed by many chemically amplified photoresists and which is necessary for catalyzing the reactions leading to differential solubility of the resists is capable of diffusing away from the vicinity where such acid is generated. see, L. Schlegel, T. Ueno, H. Hayashi, and T. Iwayanagi, *J. Vac. Sci. Technol.*, B9, 278 (1991). Diffusion of the acid moiety from such an acid amplified resist into an adjacent antireflective layer will cause decreased photoresist sensitivity, resulting in an additive defect in a positive tone process. Such decreased sensitivity is seen when acid catalyzed chemically amplified photoresists are used in conjunction with antireflective layers having compositions comprising nitrogen containing solvents as are known in the art, however the compositions of the present invention demonstrate unexpectedly improved performance.

Diffusion of the catalytic moiety is particularly severe when the underlaying antireflective layer comprises plasticizers or residual solvents, or is characterized by having relatively large, interconnected interstitial spaces within the polymer matrix. Thus, in an alternative embodiment of the present invention, it may be advantageous, but is not required, that the solvent be removed from the antireflective compositions after spin casting. In yet another alternative embodiment of the present invention, the polymer is processed by heating to a temperature above the glass transition temperature to drive residual solvent from the polymer matrix and to anneal the matrix.

As an additional unexpected benefit, the antireflective coating of the present invention provides a chemical barrier between the chemically amplified photoresist and the substrate. The chemical barrier properties are important when processing chemically amplified photoresists deposited over silicon, or over certain less reflective materials such as titanium nitride (TIN), silicon nitride ($Si_3N_4$), and TEOS, which is chemical vapor deposited silicon from tetraethyl orthosilicate. The surfaces of such materials are extremely sensitive to environmental influences, and may have an acidic or basic surface character as a result of deposition conditions, exposure to air or water, cleaning in acidic or basic solutions prior to photoresist application, retention of contaminants from a previous processing step, or as an intrinsic property of the material. For example, it is known that the cleaning of substrates having a silicon comprising surface layer in strong acids will result in an acidic surface characteristic. Similarly, the exposure of TiN to bases or the incorporation of hydrogen will give rise to a basic surface characteristic. Such acidic or basic surfaces may give rise to adverse contact reactions, and the antireflective coating of the invention functions as a barrier layer to provide quite useful protection against environmental contaminants which results in extended process latitude.

EXAMPLE 1

A mixture of cyclohexylmethyldichlorosilane (54.75 g, 0.277 mol) and diphenyldichlorosilane (17.55 g, 0.069 mol) was added rapidly to dispersed sodium (45.4 g, 40% mineral oil, 0.79 mol) in a refluxing mixture of toluene (375 ml) and diglyme (40 ml). After the addition, the mixture was refluxed for one hour and allowed to cool to room temperature. At this point, isopropyl alcohol (75 ml) was added slowly to quench any unreacted sodium and the copolymer formed was precipitated into isopropyl alcohol (2 l). The solid was gravity filtered, air dried and extracted with toluene (500 ml). The toluene extract was washed with water (3×250 ml) and dried over anhydrous sodium sulfate. Evaporation of the solvent gave 10.24 grams of copolymer: poly(cyclohexylmethylsilane-co-diphenylsilane) having an optical density of 2.4/µm.

The copolymer was dissolved in toluene to form a 10% by weight solution. After filtration, a thin film of the copolymer was deposited on the surface of a silicon wafer by spin casting at 3000 rpm for 30 seconds. The coated wafer was soft-baked at 90° C. for 60 seconds leaving a film of 0.3 µm thickness exhibiting an optical density at 248 nm of 0.72.

A deep-UV chemically amplified photoresist comprising a partially t-butyloxycarbonyloxy substituted poly(p-hydroxystyrene) i.e., poly(p-hydroxystyrene-co-p-t-butyloxycarbonyloxy-styrene) and a photoacid generator, trifluoromethyl-sulfonyloxybicyclo[2.2.1]-hept-5-ene-2,3-dicarboximide in a casting solvent propylene glycolmonomethyl ether acetate (PM acetate) was applied as a 1.0 µm thick film to the surface of the silicon wafer, which had been coated with the antireflection material, by spin casting at 3200 rpm for 30 seconds, followed by a 90° C./60 second soft-bake. The antireflective material and photoresist coated wafer was then exposed to the output of a KrF laser (5 Mj/$cm^2$) through suitable optics and reticle. The exposed wafer was baked at 90° C. for 90 seconds, allowed to cool and finally developed by immersion in 0.24N tetramethylammonium hydroxide (TMAH) / water solution.

The development removed the photoresist composition, but not the antireflective layer. The pattern may be further transferred through the antireflective layer to the substrate using $CF_4$ reactive ion etch (RIE).

EXAMPLE 2

A crosslinkable poly(cyclotetramethylenesilane) made using the synthesis provided by R. West in *J. Organomet. Chem.*, 300, 327 (1986) was coated onto silicon wafers to a thickness of about 2.0 µm as was done with the antireflective coating of Example 1.

Thereafter, the treated wafer was overcoated with the deep UV photoresist composition as set forth in Example 1 to a thickness of about 1.0 µm. The photoresist was imaged using a KrF laser and is developed with 0.24N TMAH. The image was transferred through the antireflective coating with $CF_4$ RIE.

EXAMPLE 3

Poly(2-vinylnaphthalene), 2.0 grams, available commercially (Aldrich Chemical: 19,193-0; Monomer-Polymer:7668) was dissolved in xylene (98 grams). The solution was cast upon a bare silicon wafer at a spin speed of 2400 rpm for 30 seconds. The coated wafer was then baked at 90° C. for 60 seconds yielding polymeric film with a thickness of 0.05 µm exhibiting an optical density at 248 nm of 0.26.

The deep UV chemically amplified photoresist composition of Example 1 was applied over the antireflective layer on the silicon wafer as a 1.0 µm thick coating in the manner described in Example 1. The coated wafer was imaged with a KrF laser (5mJ/$cm^2$), subjected to a post exposure bake (PEB) at 90° C. for 90 seconds, and developed by immersion in 0.24N TMAH. The pattern was further transferred through the antireflective coating with $O_2$ RIE. There was some evidence of undercutting of the image profiles.

EXAMPLE 4

Poly(2-vinylnaphthalene) having an optical density of about 5.2/μm, 1.76 grams, available commercially (Aldrich Chemical: 19,193-0; Monomer-Polymer 7668), and 240 mg of 2,6-bis(4-azidobenzylidene)-4-methylcyclohexanone (DABMC, a thermally labile cross-linking agent) were added to 98 grams of xylene. The solution, upon spin coating on a silicon wafer at 2400 rpm, yielded a polymeric film with a thickness of 0.05 μm. The coated wafer was then hard-baked at 180° C. for 90 seconds to yield a cross-linked polymeric film with an optical density at 248 nm of 0.26.

The deep UV chemically amplified photoresist composition of Example 1 was applied to the antireflective coated silicon wafer as a 1.0 μm thick coating in the manner described in Example 1. The coated wafer was imaged with a KrF laser (5mJ/cm$^2$), subjected to a post exposure bake (PEB) at 90° C. for 90 seconds, and developed by immersion in 0.24N TMAH. The pattern was further transferred through the antireflective coating with $O_2$ RIE.

EXAMPLE 5

A solution comprised of 0.93 grams poly-(2-vinyl-naphthalene), 0.07 grams 2,6-bis(4-azido-benzylidene)-4-phenylcyclohexanone (DABPC) and 49 grams xylene was prepared and filtered to 0.2 μm. The solution was cast on a spinning silicon wafer (2400 rpm for 30 seconds). The coated wafer was baked at 180° C. for 90 seconds leaving a 0.05 μm thick crosslinked film exhibiting an optical density at 248 nm of 0.27.

The deep UV chemically amplified photoresist composition of Example 1 was applied to the antireflective coated silicon wafer as a 1.0 μm thick coating in the manner described in Example 1. The coated wafer was imaged with a KrF laser (5mJ/cm$^2$), subjected to a post exposure bake (PEB) at 90° C. for 90 seconds, and developed by immersion in 0.24N TMAH. The pattern was further transferred through the antireflective coating with $O_2$ RIE.

EXAMPLE 6

Poly(1-vinylnaphthalene) was purchased commercially (Monomer-Polymer: 8170). A 4% solids solution was prepared by adding 1.8 grams polymer and 0.2 grams DABMC to 48 grams xylene. Spin coating on a bare silicon wafer at 3000 rpm followed by a post apply bake at 180° C. for 90 seconds resulted in a 0.1 μm thick film with an optical density at 248 nm of 0.5.

The deep UV chemically amplified photoresist composition of Example 1 was applied to the antireflective coated silicon wafer as a 1.0 μm thick coating in the manner described in Example 1. The coated wafer was imaged with a KrF laser (5mJ/cm$^2$), subjected to a post exposure bake (PEB) at 90° C. for 90 seconds, and developed by immersion in 0.24N TMAH. The pattern was further transferred through the antireflective coating with $O_2$ RIE.

EXAMPLE 7

Poly(acenaphthylene) is commercially available from Monomer-Polymer (8675). A 4% solution in xylene yields, upon spin casting at 3000 rpm and soft-baking at 90° C. for 60 seconds, a 0.1 μm film with an optical density at 248 nm of 0.6.

The deep UV chemically amplified photoresist composition of Example 1 was applied to the antireflective coated silicon wafer as a 1.0 μm thick coating in the manner described in Example 1. The coated wafer was imaged with a KrF laser (5mJ/cm$^2$), subjected to a post exposure bake (PEB) at 90° C. for 90 seconds, and developed by immersion in 0.24N TMAH. The pattern was further transferred through the antireflective coating with $O_2$ RIE.

EXAMPLE 8

Poly(4-vinylbiphenyl) is commercially available from Aldrich Chemical (18,254-0). To 95 grams of xylene were added 0.6 grams DABPC and 4.4 grams polymer. After filtration a thin film of the polymeric mixture was deposited on a silicon wafer by spin coating at 4000 rpm for 30 seconds. The coated wafer was baked at 200° C. for 2 minutes to yield a 0.15 μm thick film with an optical density at 248 nm of 1.6.

The deep UV chemically amplified photoresist composition of Example 1 was applied to the antireflective coated silicon wafer as a 1.0 μm thick coating in the manner described in Example 1. The coated wafer was imaged with a KrF laser (5mJ/cm$^2$), subjected to a post exposure bake (PEB) at 90° C. for 90 seconds, and developed by immersion in 0.24N TMAH. The pattern was further transferred through the antireflective coating with $O_2$ RIE.

EXAMPLE 9

The lithographic performance of the deep- UV chemically amplified photoresist composition of Example 1 comprising poly(p-hydroxy-styrene-co-p-t-butyloxycarbonyloxystyrene) and trifluoromethylsulfonyloxybicyclo[2.2.1]-hept-5-ene-2,3-dicarboximide in a PM acetate casting solvent was evaluated over a number of substrates using the crosslinked poly-(2-vinylnaphthalene)/DABMC antireflective coating of Example 4 compared to photoresist alone.

TABLE I

| Substrate | Performance |
| --- | --- |
| Silicon (HMDS)[1] | flair |
| Brewer CD-3[2] | occasional undercut |
| Brewer CD-5[2] | vertical profile |
| Brewer Omni-Layer[2] | severe footing |
| Hard-baked TNS[3] | severe footing |
| Hard-baked TNS[3] (with antireflective coating) | vertical profile |
| Silicon nitride | foot |
| Silicon nitride (with antireflective coating) | vertical profile |
| Titanium nitride | severe footing |
| Titanium nitride (with antireflective coating) | vertical profile |
| Hard baked KTFR[4] | foot |
| TEOS[5] | foot |
| TEOS[5] (with antireflective coating) | vertical profile |

[1]HMDS = hexamethyldisilazane
[2]from Brewer Science, Inc.
[3]TNS = a diazonaphthoquinone novolak resist
[4]KTFR = Kodak Thin Film Resist
[5]TEOS = tetraethylorthosilicate Thus, it is apparent from Table 1 that lithographic processes using the antireflective coating of the invention are significantly improved by the presence of the underlying antireflective layer.

EXAMPLE 10

Two sets of silicon wafers were used to show the benefits of the antireflective coatings of the invention. A control series of wafers was coated with the deep UV chemically amplified photoresist shown in Example 1. The wafers were patterned with a Canon excimer stepper (0.37NA). All lines had a nominal width of 0.5 μm.

The line width variation with respect to film thickness is shown in Table II and is plotted as 1 in FIG. 2.

TABLE II

| Film Thickness (Å) | Linewidth (μm) |
| --- | --- |
| 8183 | 0.47 |
| 8352 | 0.41 |
| 8635 | 0.53 |
| 8886 | 0.45 |
| 9342 | 0.55 |
| 9822 | 0.48 |

In a similar manner a set of wafers was first coated with 0.06 μm of the antireflective coating of Example 4 of the current invention using the processing conditions specified therein. Then the wafers were over coated with chemically amplified deep UV photoresist as above. The results are shown in Table III and as 2 in FIG. 2.

TABLE III

| Film Thickness (Å) | Linewidth (μm) |
| --- | --- |
| 8356 | 0.51 |
| 8689 | 0.49 |
| 8772 | 0.52 |
| 9352 | 0.49 |
| 9790 | 0.53 |
| 9973 | 0.50 |

It can be seen that the line width variations are greatly reduced by including the antireflective coating of the present invention in the processing.

EXAMPLE 11

Figure 3B:
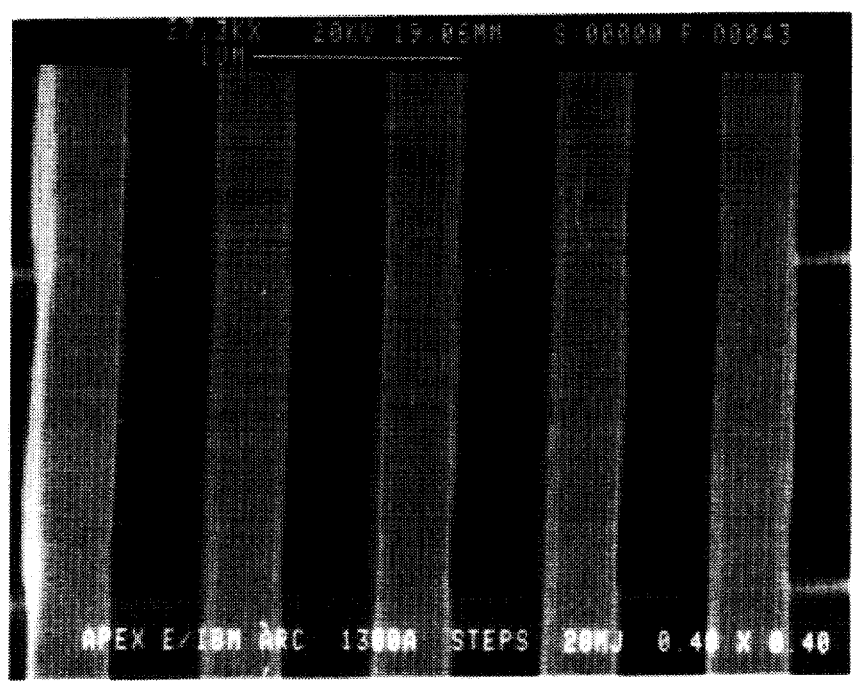

Poly(bis-phenol-A)ethersulfone (Udel P1700/P3500 Resin, commercially available from Amoco Chemical, and Ultrason 1010, available from BASF) was dissolved in cyclohexanone to give a solution having 3% by weight solids. The solution was applied to a silicon wafer having 5000 Å oxide lines patterned thereon by spin casting and the resulting film was baked at 200° C. for 60 seconds. After baking, the antireflective film had a thickness of about 1300 Å and an optical density of about 0.7 at a wavelength of 248 nm. The deep-UV sensitive, chemically amplified resist composition of example 1 was applied to the antireflective coated wafer, and also to a control wafer having 5000 Å oxide lines over silicon but without the antireflective layer, to obtain 1.0 μm thick coatings in the manner described in example 1. Each resist coated wafer was patternwise exposed to UV radiation from a KrF laser at a dose of 5 mJ/cm$^2$ then subjected to a post exposure bake at 90° C. for 90 seconds to form a latent image. The latent image was developed by immersion in 0.24N aqueous tetramethyl ammonium hydroxide to form a relief image in the photoresist. The relief image pattern was transferred into and through the antireflective layer by means of an O$_2$ reactive ion etching step. Etched resist over antireflective layer features consisting of lines and spaces having a 1.0 μm pitch and extending over 0.5 μm oxide steps were examined by SEM on the wafers with and without the antireflective coating. Electron micrographs of a section of each wafer are shown in FIGS. 3A and 3B. Without the antireflective underlayer, the images were distorted. With the antireflective underlayer, straight walled images, free of reflective distortion were obtained.

EXAMPLE 12

Figure 4:
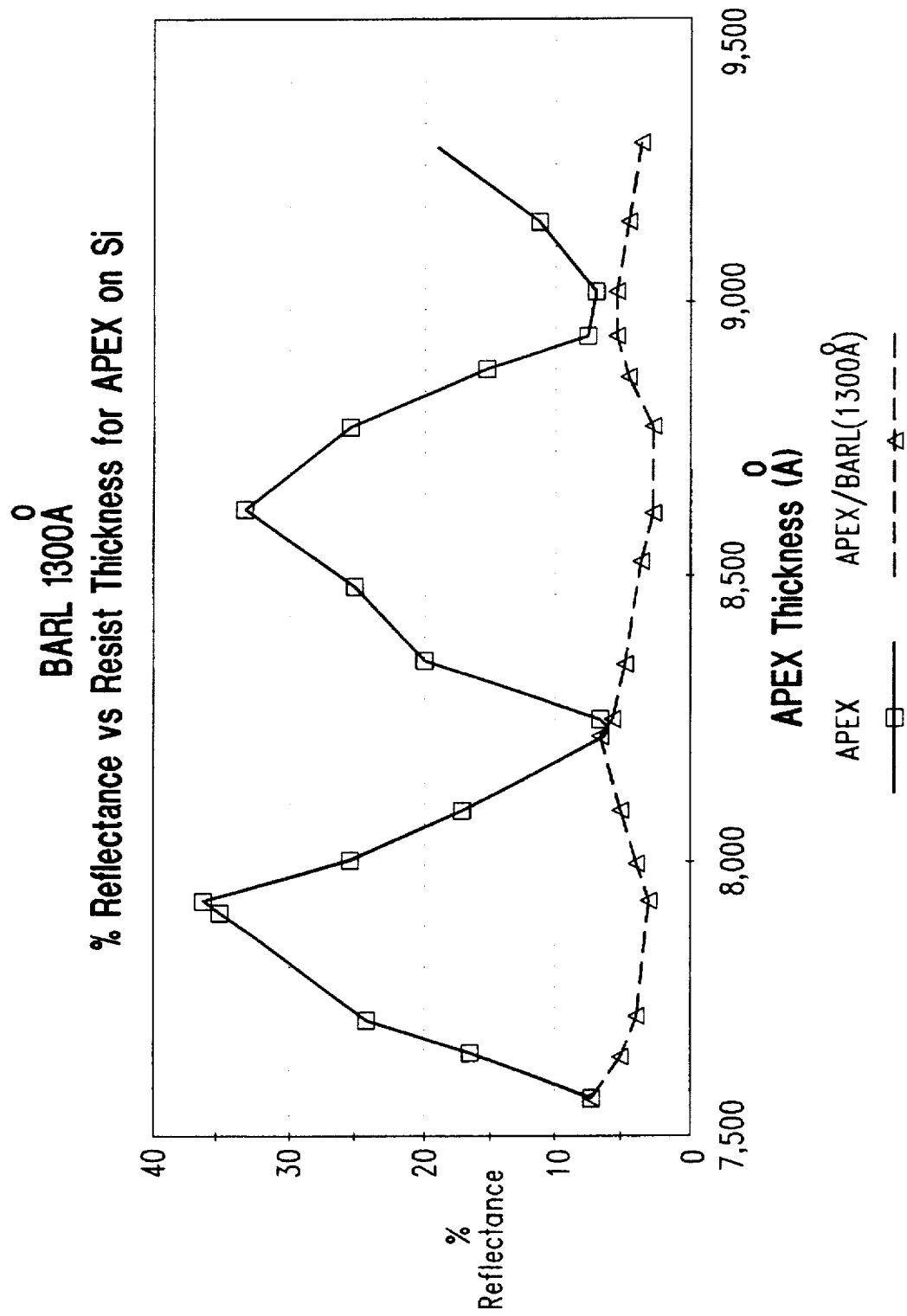
FIG. 4 is a graph showing reflectance as a function of photoresist thickness with and without the antireflective coating compositions of the invention.

A series of 17 antireflective coated silicon wafers were prepared by applying and baking the antireflective composition of Example 11 using the method described to obtain a 1300 Å thick film on each wafer. A layer of the chemically amplified photoresist composition of claim 1 was then applied to each wafer using a different spin speed for each wafer to obtain overlying photoresist film thicknesses in the range from about 7500 Å to about 9300 Å. A control series of wafers was prepared wherein the photoresist of Example 1 was applied directly to the silicon wafer without the antireflective layer, to give photoresist films having thicknesses in a similar range. Using a standard reflectometer at a wavelength of about 248 nm, the reflectance of each wafer was measured, to examine the reduction in reflectivity at 248 nm with the antireflective coating. As shown in FIG. 4, the chemically amplified resist of example 1 showed a reflectivity reduction upon the use of the antireflective coating of greater than 90%.

EXAMPLE 13

An antireflective composition was prepared consisting of a 2% by weight solution in cyclopentanone of the imidized soluble polyimide derived from the condensation reaction between a mixture of 5-amino-1-(4'-aminophenyl)-1,3,3-trimethylindane and 6-amino-1-(4'-aminophenyl)-1,3,3-trimethylindane with 3,3',4,4'-benzophenone tetracarboxylic dianhydride (MATRIMID XU 218, commercially available from Ciba-Geigy). The composition was coated on a silicon wafer and then baked at about 180° C. for 2.0 min. The resulting antireflective film had a thickness of about 700 Å and had an optical density of about 0.4 at a wavelength of about 248 nm. The positive tone chemically amplified photoresist of Example 1 was applied by spin coating over the antireflective film and subsequently baked to achieve a photoresist film thickness of about 1.0 μm. The coated wafer was patternwise exposed to UV radiation from a KrF excimer laser source having a wavelength of about 248 nm. The photoresist was then baked for 1 min at about 90° C., and developed in 0.24N tetramethylammonium hydroxide solution to form a relief structure in the resist. The relief pattern was transferred into the underlying antireflective layer by oxygen reactive ion etching. A portion of the patterned and etched wafer was examined by scanning electron microscopy and the photoresist relief structures were observed to have straight and vertical side walls on top of the polyimide film with no protrusions or indentations at the interface between the photoresist and antireflective layer films.

While the polymers disclosed herein are intrinsically UV radiation absorbing, and the practitioner will appreciate that a separate chromophoric dye is not required, it will also be appreciated by the artisan that one or more dyes may be added to alternative embodiments to enhance certain optical properties of the antireflective coating compositions of the invention.

Although this invention has been described with respect to specific embodiments, the details thereof are not to be construed as limitations, for it will become apparent that various embodiments, changes and modifications may be resorted to without departing from the spirit and scope thereof, and it is understood that such equivalent embodiments are intended to be included within the scope of this invention.

We claim:

1. An antireflective coating composition for use with chemically amplified photoresist compositions comprising a poly(arylether) polymer, which is highly absorbent to mid and/or deep UV radiation, which is substantially inert to contact reactions with a chemically amplified photoresist composition, and which is insoluble in the developer for the chemically amplified photoresist composition.

2. A photoresist structure having at least two layers and overlaying a semiconductor substrate comprising
   an antireflective first layer coated upon said substrate wherein the antireflective layer comprises a poly(arylether) polymer, and wherein the antireflective layer is substantially inert to contact reactions with the photoresist layer, and wherein the antireflective layer is insoluble in the developer for the photoresist layer, and
   a second layer coated upon said antireflective first layer comprising a chemically amplified photoresist which is sensitive to ultraviolet radiation having a wavelength in the range from about 180 nm to about 350 nm.

3. The photoresist structure of claim 2 wherein the antireflective first layer has an optical density of at least 2.0/µm at the imaging wavelength of an overlaying photoresist layer.

4. The photoresist structure of claim 2 wherein the antireflective first layer has an absolute optical density of at least 0.25 at the imaging wavelength of an overlaying photoresist layer.

5. The photoresist structure of claim 2 wherein the antireflective first layer has an optical density of at least 2.0/µm over the range of wavelengths from about 235 nm to about 280 nm.

6. The photoresist structure of claim 2 wherein the antireflective first layer has an absolute optical density of at least 0.25 over the range of wavelengths from about 235 nm to about 280 nm.

7. The photoresist structure of claim 2 wherein the antireflective first layer is chemically non-reactive with the photoresist second layer.

8. The photoresist structure of claim 2 wherein the antireflective first layer is immiscible with the photoresist second layer.

9. The photoresist structure of claim 2 wherein the antireflective first layer is essentially insoluble in photoresist casting solvents selected from the group consisting of alcohols, esters, and ethers.

10. The photoresist structure of claim 2 wherein the poly(arylether) polymer is a poly(arylethersulfone).

11. The photoresist structure of claim 10 wherein the poly(arylethersulfone) is a poly(bis-phenol-A)ethersulfone.

12. The photoresist structure of claim 2 wherein the antireflective first layer is obtained from a solution of the poly(arylether) polymer further comprising a cyclohexanone solvent.

13. The photoresist structure of claim 2 wherein the poly(arylether) polymer itself absorbs UV radiation at the imaging wavelength.

14. The photoresist structure of claim 2 wherein the antireflective first layer is further characterized by the absence of a dye component separate from the poly(arylether) polymer.

15. The photoresist structure of claim 2 wherein the antireflective first layer additionally comprises a dye.

16. A method of making a relief image by photolithography comprising the steps of:
   applying, to a lithographic substrate, a layer of an antireflective coating composition for use with chemically amplified photoresist compositions, wherein the antireflective coating composition comprises a poly(arylether) polymer which is highly absorbent to mid and/or deep UV radiation, which is substantially inert to contact reactions with a chemically amplified photoresist composition, and which is insoluble in the developer for the chemically amplified photoresist composition; and
   applying, over the antireflective coating composition, a layer of a chemically amplified photoresist composition; and
   exposing the photoresist composition to form a latent image; and
   developing the latent image to form a relief image pattern in the photoresist; and
   dry etching the relief image pattern into the antireflective coating layer.

17. The method of claim 16 additionally comprising the step of heating the antireflective coating layer to a temperature in excess of the glass transition temperature of the poly(arylether) polymer.

18. The method of claim 16 wherein the poly(arylether) polymer is further characterized as having a glass transition temperature higher than the temperature to which the chemically amplified photoresist is heated, and additionally comprising the step of:
   after applying a layer of said chemically amplified photoresist composition, the step of heating the chemically amplified photoresist.

19. The method of claim 18 additionally comprising the step of: after exposing the photoresist composition to form a latent image, the step of heating the chemically amplified photoresist.

20. The method of claim 16 wherein the poly(arylether) polymer is further characterized as having a glass transition temperature higher than the temperature to which the chemically amplified photoresist is heated, and additionally comprising the step of:
   after exposing the photoresist composition to form a latent image, the step of heating the chemically amplified photoresist.

* * * * *

UNITED STATES PATENT AND TRADEMARK OFFICE
CERTIFICATE OF CORRECTION

PATENT NO. : 5,554,485

DATED : September 10, 1996

INVENTOR(S) : Robert R. Dichiara, James T. Fahey, Pamela E. Jones, Christopher F. Lyons, Wayne M. Moreau, Ratnam Sooriyakumaran, Gary T. Spinillo, Kevin M. Welsh, an Robert L. Wood It is certified that error appears in the above-indentified patent and that said Letters Patent is hereby corrected as shown below:

In Column 1, line 8, after "Ser. No.", please delete 08/017,939, and substitute therefore -- 08/017,938 --.

Signed and Sealed this

Tenth Day of December, 1996

Attest:

BRUCE LEHMAN

Attesting Officer     Commissioner of Patents and Trademarks